United States Patent [19]

Williams et al.

[11] Patent Number: 4,687,545

[45] Date of Patent: Aug. 18, 1987

[54] PROCESS FOR STRIPPING TIN OR TIN-LEAD ALLOY FROM COPPER

[75] Inventors: Ann S. Williams, Southbury; Raymond A. Letize, West Haven, both of Conn.

[73] Assignee: MacDermid, Incorporated, Waterbury, Conn.

[21] Appl. No.: 875,614

[22] Filed: Jun. 18, 1986

[51] Int. Cl.[4] .......................... C23F 1/00; B44C 1/22; C03C 15/00; C03C 25/06

[52] U.S. Cl. ........................................ 156/651; 134/3; 134/28; 134/29; 156/656; 156/664; 156/667; 252/79.3; 252/79.4; 252/79.5

[58] Field of Search ............... 156/651, 656, 664, 667; 252/79.3, 79.4, 79.5; 134/3, 41, 28, 29

[56] References Cited

U.S. PATENT DOCUMENTS

| | | | |
|---|---|---|---|
| 2,872,361 | 2/1959 | Siefen et al. | 156/651 X |
| 4,397,753 | 8/1983 | Czaja | 252/79.4 X |
| 4,424,097 | 1/1984 | Lipka et al. | 156/656 |

Primary Examiner—William A. Powell
Attorney, Agent, or Firm—St. Onge Steward Johnston & Reens

[57] ABSTRACT

A two step process is described for selectively stripping tin or tin-lead alloys from a copper substrate without significant loss of copper from the substrate. In a first step the substrate coated with tin or tin-lead alloy is subjected to the action of a first stripping composition which can be any of those known in the art containing a mixture of an oxidant for the metal or metals of said layer and an acceptor for the cation or cations so oxidized. When the stripping has reached the stage at which a thin film of tin remains on the copper substrate the latter is subjected to the action of a second stripping composition which comprises a mixture of an alkali metal hydroxide and an alkali metal chlorite until the film of tin has been removed and replaced by a film of copper oxide. If desired, the latter can be removed by known means such as treatment with aqueous acid.

The process represents an improvement over known processes in which, in order to remove the last traces of tin from the copper substrate or to remove the film of tin which in some cases is re-deposited from the stripper composition itself, it is necessary to employ stripping conditions so rigorous that significant loss of copper from the substrate takes place.

While the process of the invention is applicable to stripping of tin or tin-lead alloys from copper substrates in a wide variety of contexts, it is of particular application to stripping etch resists from copper substrates after completion of the etching step in formation of a printed circuit board.

23 Claims, No Drawings

PROCESS FOR STRIPPING TIN OR TIN-LEAD ALLOY FROM COPPER

BACKGROUND OF THE INVENTION

This invention relates to an improved process for removing tin and tin-lead alloy coatings from copper substrates and is more particularly concerned with a two step process for removing said coatings from a copper substrate without removing any significant amount of the copper substrate itself.

There is a wide range of situations in which it is necessary to remove a layer of tin or tin-lead alloys such as solder from a copper substrate. Illustratively, the rejects which sometimes arise in the electroplating of copper components with a layer often have to be stripped of the layer in order to recover and re-use the copper substrate.

Another situation is that which involves removal of tin or tin-lead alloy etch resists from copper substrates. A particular example of this stripping tin-lead etch resists employed in the fabrication of solder mask on bare copper (SMOBC) type printed circuit boards. Thus, in such fabrication, tin-lead alloys are plated onto a copper substrate in a predetermined pattern to delineate the printed circuit and to serve as an etch resist in subsequent etching of the copper. After the etching is completed the presence of the tin-lead in the through holes of the board and their surrounding pads is desirable to improve solderability. However, in some areas, it is preferable to remove the tin-lead especially from sliding contact fingers where these are to be plated with nickel and/or gold to improve conductivity. Removal of tin-lead from circuit traces is also desirable prior to covering the circuit with solder mask.

The stripper compositions hitherto employed in the art to remove tin and tin-lead alloys from copper substrates generally fall into one of three classes. One class is based on nitro-substituted aromatic compounds such as nitro-substituted aromatic sulfonic acids and salts thereof as the principal, or one of the principal, active ingredients. Representative of this class are the compositions disclosed in U.S. Pat. Nos. 3,677,949; 4,004,956; 4,397,153; and 4,439,338. A second class of compositions is based on hydrogen peroxide as the principal active ingredient in acidic medium. Representative of this class are the compositions disclosed in U.S. Pat. Nos. 3,926,699; 3,990,982; 4,297,257; 4,306,933; 4,374,744; and 4,424,097. A third class comprises a mixture of an alkali metal hydroxide and a chlorite in concentrated aqueous solution. However, this type of stripper composition is significantly slower (approximately 10 times slower) than the first class of stripper mentioned above.

In the case of the first two classes of composition mentioned above there is present a combination of an oxidant for the tin or tin-lead and an acceptor for the cation or cations so oxidized. The oxidant is the nitro-substituted aromatic compound or the hydrogen peroxide and the acceptor is an acid as fluoboric, acetic or like aliphatic acid or aromatic acids.

The hydrogen peroxide based compositions have a number of disadvantages. Thus they are too unstable on storage to be provided in ready-to-use form and have to be prepared just prior to use. Further, the reaction involved in the stripping using the hydrogen peroxide based compositions is highly exothermic and the tin-lead alloy turns black. A white deposit is formed on the substrate and significant attack and removal of copper from the substrate takes place.

Of the various classes of stripper the nitro-aromatic compound-based compositions are generally preferred since they have much greater stability and are less aggressive towards the copper substrate than the hydrogen peroxide based compositions. However, they suffer the drawback that a residual thin layer of tin, due either to incomplete stripping or redeposition of tin from the stripping bath, is difficult to remove without excessive attack on the copper substrate itself. Brindisi et al, U.S. Pat. No. 3,677,949 sought to overcome the problem of tin redeposition by adding a thiourea to the stripper bath which comprised a nitro-aromatic sulfonic acid or like compound and a fluoboric acid. It is found in practice, however, that such formulations are not stable on storage and the thiourea is precipitated in orange-brown crystalline form. Czaja U.S. Pat. No. 4,397,753 reported finding a whitish residue on the copper substrate after stripping using a formulation prepared as taught by Brindisi et al and recommended the addition of a hydroxyphenol to a nitro-substituted aromatic sulfonic acid/fluoboric acid mixture.

It has been found that both the Brindisi et al and the Czaja compositions will strip tin-lead alloys from copper substrates in a clean manner when the stripper solution is relatively fresh and the dissolved tin concentration is less than about 1 gram per liter. However, in actual practice, this level is rapidly reached and thereafter re-deposition of tin from the solution apparently occurs.

The present invention is based on the finding that the thin residual layer of tin remaining on the copper substrate after stripping using the prior stripping compositions can be removed readily without employing rigorous stripping conditions and without sacrifice of any significant amount of copper from the underlying substrate.

SUMMARY OF THE INVENTION

It is an object of the invention to remove the residual thin layer of tin generated in stripping tin or tin-lead alloys from a copper substrate without significant loss of copper from said substrate.

It is another object of the invention to strip tin or tinlead alloys cleanly from a copper substrate without significant loss of copper from said substrate.

It is yet another object of the invention to strip tin-lead etch resists from copper substrates in the fabrication of SMOBC type printed circuit boards.

These objects, and other objects which will become apparent from the description which follows, are achieved by the process of the invention which comprises a process for stripping a layer of metal selected from tin and tin-lead alloys from a copper substrate. The process comprises the steps of (a) subjecting the coated substrate to the action of a first stripper composition comprising an oxidant for the metal or metals of said layer and an acceptor for the cation or cations so oxidized until only a thin film of said layer remains on said substrate and (b) thereafter subjecting said substrate to the action of a second stripper composition comprising an aqueous solution containing a mixture of an alkali metal hydroxide and an alkali metal chlorite until said thin film of metal has been removed.

DETAILED DESCRIPTION OF THE INVENTION

The first step of the process of the invention can be carried out using any of the known stripper compositions based on nitro-substituted aromatic compounds or on hydrogen peroxide in acidic media. Examples of such compositions are set forth in the various U.S. patents discussed hereinabove. In a preferred embodiment of the process of the invention the first step is carried out using a nitro-substituted aromatic compound as the oxidant and an inorganic or organic acid or acids as the cation acceptor. The nitro-substituted aromatic compound can be any aromatic compound having one or more nitro-substituents on the aromatic ring and having a water-solubilizing substituent also attached to the aromatic ring. Illustrative of such compounds are o-, m- and p-nitrobenzene sulfonic acids and alkali metal salts thereof; o-, m- and p-nitrobenzoic acids and alkali metal salts thereof; o-, m- and p-nitrochloro benzenes, o-, m- and p-nitrophenols; and o-, m- and p-nitroanilines and mineral acid salts thereof. A preferred group of nitro-substituted aromatic compounds are the nitrobenzene sulfonic acids and alkali metal salts thereof. A particularly preferred such compound is sodium m-nitrobenzene sulfonate.

The inorganic acids employed in association with the nitroaromatic compounds can be any of those which are capable of readily reacting with tin and lead to form water-soluble salts but which do not form a water-insoluble film on the tin or tin-lead alloy being stripped. Illustrative of such inorganic acids are fluoboric and fluosilicic acids and sulfamic acid.

Optionally, but preferably, there is also present in the above stripper compositions an organic acid such as formic, acetic, propionic, chloroacetic, bromoacetic, trichloroacetic acids and the like which act as accelerators in enhancing the rate of stripping.

The various components of the stripping composition are present advantageously in proportions within the following ranges:

nitroaromatic compound 30 to 120 g. per liter
inorganic acid 50 to 200 g. per liter
organic acid 25 to 100 g. per liter
water to make 1 liter.

The first step of the process of the invention is carried out advantageously by exposing the substrate to be stripped to the action of the stripper composition. This is most conveniently accomplished by immersing the substrate in a bath of the stripper composition. The latter is preferably heated or preheated to a temperature within the range of about 20° C. to about 70° C. and most preferably to a temperature within the range of about 25° C. to about 60° C. The progress of the stripping can be followed by periodic visual inspection or by measuring weight loss of the substrate at periodic intervals until a point is reached at which only a thin layer or "smut" of tin remains on the copper substrate. Where the process of the invention is being applied to the stripping of a tin-lead alloy the end point of this first step is characterized by a readily detectable color change from the blue-gray of the tin-lead alloy to the brown-gray of tin film.

When this end-point has been reached the substrate is removed from the stripper bath and subjected to a water rinse before being treated in accordance with the second step of the process of the invention.

The stripper composition employed in the second step of the invention to remove the thin layer or smut of tin comprises an aqueous solution containing as the principal active ingredients a mixture of an alkali metal hydroxide and an alkali metal chlorite. Any of the alkali metal hydroxides and chlorites, i.e. the sodium, potassium and lithium hydroxides and chlorites can be used in any combination. However, a particularly preferred combination comprises a mixture of sodium hydroxide and sodium chlorite. The alkali metal hydroxide is advantageously employed in a concentration within the range of about 10 to about 200 grams per liter and, preferably, in the range of about 100 to about 200 grams per liter. The alkali metal chlorite is advantageously employed in a concentration within the range of about 5 grams per liter up to saturation and, preferably, in the range of about 50 to about 150 grams per liter.

The second step of the process of the invention is carried out advantageously by subjecting the substrate, after treatment in the first step as described above, to the action of the second stripper composition. This is accomplished conveniently by immersing the substrate in a bath of said stripper composition. The latter is preferably heated or pre-heated to a temperature within the range of about 20° C. to about 100° C. and most preferably to a temperature within the range of about 50° C. to about 100° C. The progress of the removal of the smut-layer of tin can be followed best by visual inspection. The endpoint is signalled by a change in color of the surface of the substrate from the brown-gray of the tin smut-film to a dark brown or black color due to formation of a film of copper oxide. When this stage is reached, generally within a matter of a few minutes, the substrate is removed from the bath and rinsed with water to remove last traces of the stripper solution.

If the presence of the copper oxide film is undesirable, i.e. might interfere with subsequent operations to which the substrate is to be subjected, the substrate is immersed briefly in a bath of aqueous acid such as dilute sulfuric or hydrochloric acids in order to remove the copper oxide and leave a clear surface on the copper substrate.

It is found that the process of the invention is relatively fast, each of the steps requiring only a few minutes in the majority of cases, and results in complete removal of the tin or tin-alloy without sacrifice of any significant amount of the copper from the substrate. Accordingly the process represents a significant improvement over the processes previously employed in the art. The latter involved either using the stripper employed in the first step alone but under such rigorous conditions as to cause significant attack on the copper substrate or using the stripper employed in the second step alone and requiring such a lengthy operation as to make the procedure economically unfeasible.

As set forth above, the process of the invention can be applied to a wide variety of situations in which it is desired to strip tin or tin-lead alloys from a copper substrate. Illustratively, the process can be employed to recover copper substrate from rejects derived in the electroplating of copper with tin and in the removal of tin-lead alloy etch resists employed in the fabrication of SMOBC type printed circuit boards. Other applications of the process of the invention will be readily apparent to those skilled in the art and the scope of the invention is not limited to the uses which have been specifically discussed and exemplified therein.

The following examples describe the manner and process of making and using the invention and set forth the best mode contemplated by the inventors of carrying out the invention but are not to be construed as limiting.

EXAMPLE 1

In carrying out a process according to the invention a first stripper composition was prepared by dissolving 150 grams of sodium m-nitrobenzene sulfonate, 200 grams of fluoboric acid and 50 grams of acetic acid in sufficient water to make 1000 mls of solution. The resulting solution was heated to about 40° C. and a sheet of tin-lead alloy (60 percent tin : 40 percent lead by weight) was immersed therein until 5 grams of the alloy had been dissolved. A printed circuit board which had been plated with a 0.0012 inch layer of tin-lead alloy (same composition as above) was then immersed in the above bath (after removal of the tin-lead alloy sheet) maintained at about 40° C. The board was kept in the bath until the blue-gray color of the tin-lead alloy had been replaced by the brown-gray color of a "smut" film of tin. Total immersion time was about 10 minutes. The resulting board was then rinsed with water and immersed in an aqueous solution containing 100 grams per liter of sodium chlorite and 200 grams per liter of sodium hydroxide maintained at 95° C. After 6 minutes of immersion the color of the metal surface of the copper substrate changed from a browngray to the clear light brown color of copper oxide. The board was then rinsed with water and immersed briefly (about 60 seconds) in a 10% by weight aqueous sulfuric acid bath until the underlying copper surfaces appeared clean and bright. Comparison of the weight of the circuit board prior to the initial plating with the tin-lead alloy and its weight after the stripping operation had been completed showed that no significant amount of copper had been lost during the stripping operation.

What is claimed is:

1. In a process for stripping a layer of metal selected from tin and tin-lead alloys from a copper substrate the steps comprising:
    subjecting said coated substrate to the action of a first stripper composition comprising an oxidant for the metal or metals of said layer and an acceptor for the cation or cations so oxidized until only a thin film of said layer remains on said substrate;
    and thereafter subjecting said substrate to the action of a second stripper composition comprising an aqueous solution containing a mixture comprising an alkali metal hydroxide and an alkali metal chlorite until said thin film of metal has been removed.

2. A process according to claim 1 wherein exposure to said second stripper composition is continued until the surface of said substrate undergoes a color change.

3. A process according to claim 1 wherein the copper substrate, after completion of the second stripping step, is subjected to the action of aqueous acid to remove a film of copper oxide.

4. A process according to claim 1 wherein said first stripper composition comprises an aqueous solution comprising fluoboric acid and a member selected from nitro-substituted aromatic sulfonic acids and alkali metal salts thereof.

5. A process according to claim 4 wherein said nitro-substituted aromatic sulfonic acid is m-nitrobenzene sulfonic acid and said first stripper composition also comprises acetic acid.

6. A process according to claim 1 wherein said second stripper composition comprises a mixture of sodium hydroxide and sodium chlorite.

7. A process for completely stripping a layer of a metal selected from tin and tin-lead alloys from a copper substrate without significant loss of copper from said substrate wherein said process comprises the steps of:
    subjecting said coated substrate to the action of a first stripper composition comprising an aqueous solution comprising as the active ingredients fluoboric acid and a member selected from nitro-substituted aromatic sulfonic acids and alkali metal salts thereof until only a thin film of said metallic layer remains on said substrate; and
    thereafter subjecting said substrate to the action of a second stripper composition comprising an aqueous solution containing a mixture comprising sodium hydroxide and sodium chlorite until said thin film of metal has been removed.

8. A process according to claim 7 wherein the copper substrate, after completion of said second stripping step, is subjected to the action of aqueous acid to remove a film of copper oxide therefrom.

9. A process according to claim 8 wherein said acid is aqueous sulfuric acid.

10. A process according to claim 7 wherein said nitro-substituted aromatic sulfonic acid in said first stripper composition is m-nitrobenzene sulfonic acid in the form of its sodium salt.

11. A process according to claim 10 wherein said first stripper composition also comprises acetic acid.

12. A process according to claim 7 wherein the amount of sodium hydroxide in said second stripper composition is from about 100 to about 200 grams per liter and the amount of sodium chlorite in said second stripper composiion is from about 50 to about 150 grams per liter.

13. A process according to claim 7 wherein said coated substrate is subjected to the action of said first stripping composition by immersion in a bath of said composition at a temperature in the range of about 20° C. to about 70° C.

14. A process according to claim 7 wherein said substrate, after being subjected to the action of said first stripping composition, is subjected to the action of said second stripping composition by immersion in a bath of the same at a temperature of about 20° C. to about 100° C.

15. In a process for stripping a tin-lead etch resist from a copper substrate after the completion of the etching step in formation of a printed circuit board, the steps comprising:
    subjecting said etch resist to the action of a first stripper composition comprising an oxidant for tin and lead and an acceptor for the tin and lead cations so oxidized until only a thin layer of tin remains on said etched copper substrate; and
    thereafter subjecting said substrate to the action of a second stripper composition comprising an aqueous solution containing a mixture comprising an alkali metal hydroxide and an alkali metal chlorite until said thin film of tin has been removed.

16. A process according to claim 15 wherein said first stripper composition is an aqueous solution which comprises a mixture of fluoboric acid and a member selected from nitro-substituted aromatic sulfonic acids and alkali metal salts thereof.

17. A process according to claim 16 wherein said nitrosubstituted aromatic sulfonic acid is m-nitrobenzene sulfonic acid in the form of its sodium salt.

18. A process according to claim 16 wherein said first stripper composition also comprises acetic acid.

19. A process according to claim 15 wherein said second stripper composition comprises a mixture of sodium hydroxide and sodium chlorite.

20. A process according to claim 15 wherein said copper substrate with tin-lead etch resist attached is subjected to the action of said first stripping composition by immersion in a bath of said composition at a temperature in the range of about 20° C. to about 70° C.

21. A process according to claim 15 wherein said substrate, after being subjected to the action of said first stripping composition, is subjected to the action of said second stripping composition by immersion in a bath of the same at a temperature of about 20° C. to about 100° C.

22. A process according to claim 15 wherein the substrate, after completion of said second stripping step, is subjected to the action of aqueous acid to remove a film of copper oxide therefrom.

23. A process according to claim 22 wherein said acid is aqueous sulfuric acid.

* * * * *